(12) United States Patent
Sasaki (10) Patent No.: US 6,518,688 B1
(45) Date of Patent: Feb. 11, 2003

(54) PIEZOELECTRIC VIBRATION DEVICE

(75) Inventor: Yukinori Sasaki, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/674,449

(22) PCT Filed: Feb. 23, 2000

(86) PCT No.: PCT/JP00/01031

§ 371 (c)(1),
(2), (4) Date: Feb. 28, 2001

(87) PCT Pub. No.: WO00/52821

PCT Pub. Date: Sep. 8, 2000

(30) Foreign Application Priority Data

Mar. 1, 1999 (JP) ............................................ 11-052186

(51) Int. Cl.[7] .............................................. H01L 41/08
(52) U.S. Cl. .......................... 310/320; 310/366; 310/367
(58) Field of Search ................................ 310/320, 333, 310/346, 366, 367, 326

(56) References Cited

U.S. PATENT DOCUMENTS

| | | | | |
|---|---|---|---|---|
| 4,547,691 A | * | 10/1985 | Valdois et al. | 310/361 |
| 4,701,987 A | | 10/1987 | Studer | 29/25.35 |
| 4,870,313 A | * | 9/1989 | Hirama et al. | 310/320 |
| 5,057,801 A | * | 10/1991 | Kittaka et al. | 310/366 |
| 5,481,154 A | * | 1/1996 | Kaida | 310/368 |
| 5,548,178 A | * | 8/1996 | Eda et al. | 310/349 |
| 5,548,180 A | * | 8/1996 | Kaida | 310/367 |
| 5,679,999 A | * | 10/1997 | Nagahama | 310/351 |
| 6,191,524 B1 | * | 2/2001 | Sasaki et al. | 310/367 |

FOREIGN PATENT DOCUMENTS

| | | | | |
|---|---|---|---|---|
| JP | 59-128814 | | 7/1984 | ............ H03H/9/19 |
| JP | 61-3514 | | 1/1986 | ............ H03H/9/17 |
| JP | 2-78313 | | 3/1990 | ............ H03H/9/19 |
| JP | 06291590 | | 10/1994 | ............ H03H/9/19 |
| JP | 07212171 | | 8/1995 | ............ H03H/9/05 |
| JP | 07254839 | | 10/1995 | ............ H03H/9/19 |
| JP | 07321593 | | 12/1995 | ............ H03H/9/19 |
| JP | 0804044 A | * | 3/1996 | ................ 310/326 |
| JP | 08084044 | | 3/1996 | ............ H03H/9/19 |
| JP | 09139651 | | 5/1997 | ............ H03H/9/19 |

OTHER PUBLICATIONS

Australian Search Report corresponding to application No. SG 0005652–3 dated Aug. 29, 2001.
Japanese search report for PCT/JP00/01031 dated Jun. 6, 2000.
English translation of form PCT/ISA/210.

* cited by examiner

Primary Examiner—Thomas M. Dougherty
(74) Attorney, Agent, or Firm—RatnerPrestia (57) ABSTRACT

A piezoelectric vibration element comprises a vibration element part 1, a vibration propagation part 2 made of a same material with a greater thickness than the vibration element part 1, a groove 6 disposed in the boundary of the vibration element part 1 and vibration propagation part 2, excitation electrodes 3 confronting the face side and back side of the vibration element part 1, a connection electrode 4 disposed in the vibration propagation part 2, and an external lead-out electrode 5 connected electrically to the connection electrode 4. In this piezoelectric vibration element, the main vibration is the overtone mode, that is, when the lowest order wave mode is first-order or second-order, the wavelength in the thickness direction is (2n+1) times (n being a natural number) thereof.

9 Claims, 9 Drawing Sheets

Lowest-order
wave mode

FIG. 10B

Third-order
overtone mode

PIEZOELECTRIC VIBRATION DEVICE

This Application is a U.S. National Phase Application of PCT International Application PCT/JP00/01031.

1. Field of the Invention

The present invention relates to a piezoelectric vibration element relating to thickness mode such as piezoelectric vibration element and piezoelectric filter in which the overtone mode is the main vibration.

2. Background of the Invention

As a piezoelectric vibration element (hereinafter simply referred to as PVE) using bulk waves which are waves propagating in a solid matter, the PVE used as clock source for various electronic appliances and the piezoelectric filter used for frequency extraction of communication appliances are known.

In the recent trend of higher density, higher speed and larger capacity in electronic appliances, the frequency region used in such PVE is shifted to the higher frequency side. As the vibration mode, the thickness vibration such as thickness slide direction and thickness longitudinal direction is often employed. However, since the resonance frequency of the PVE using the thickness vibration is inversely proportional to the plate thickness of the element, thinning of element plate is indispensable for heightening of frequency. In the element thinning process, the element machining method must be determined in consideration of the mechanical strength of the piezoelectric materials, machining precision such as parallelism of plate thickness and distribution within the plane, and reduction of cost. In an ordinary method, the limit of plate thickness of piezoelectric material is about 50 μm. Converting this value of plate thickness into frequency, in the case of vibration of lowest order wave mode, even when the thickness longitudinal vibration of fast vibration transmission speed is used, the upper limit of the vibration frequency is about 70 MHz. In the case of a higher frequency, the overtone mode is obtained, that is, the wavelength in the thickness direction is (2n+1) times (n being a natural number) of the lowest order wave mode (hereinafter simply referred to as LOWM). Herein, the LOWM is often the first-order mode usually having a half wavelength in the thickness direction.

As the prior art, the polarized inverted layer forming technique of lithium niobate is disclosed in Japanese Laid-open Patent No. 63-311808, and the direct bonding technique of piezoelectric single crystal substrate is disclosed in "Variable Property Crystal Resonators by Direct Bonding Techniques" in IEEE Ultrasonics Symposium, pp. 897–900, 1996.

In a structure in which the axis of polarization is inverted in the center of the thickness direction, the LOWM may be a second-order mode having one wavelength in the thickness direction. That is, when the LOWM is first-order, the overtone mode is third-order, fifth-order, seventh-order, and so forth. When the LOWM is second-order, the overtone mode is sixth-order, tenth-order, fourteenth-order, and so forth. However, even when the overtone mode is used, there is an LOWM at the low frequency side. Accordingly, if suppression of LOWM is imperfect, the oscillation frequency may jump or other abnormal oscillation may occur in an oscillation circuit using a PVE.

Herein, methods for suppressing the LOWM include:

A method of suppressing the LOWM by circuit configuration of oscillation circuit or the like, so that a desired order number may be utilized; and A method of suppressing the LOWM by material or structure of the PVE.

The method of suppressing the LOWM by circuit configuration includes the overtone mode oscillation circuit. In this circuit, an LC resonance circuit of coil and capacitor is added to the oscillation circuit used in the LOWM. By adding this LC resonance circuit, it is designed to tune in the mode of a desired order, and oscillate in the overtone mode. As other circuit configuration, the same operation is possible in a Colpitts oscillator using transistors.

On the other hand, the method of suppressing the LOWM by the PVE itself includes a method of selecting such a piezoelectric material that the LOWM is hardly excited as compared with the overtone mode, and a method of suppressing the LOWM by the structure of the vibration element.

Figure 8:
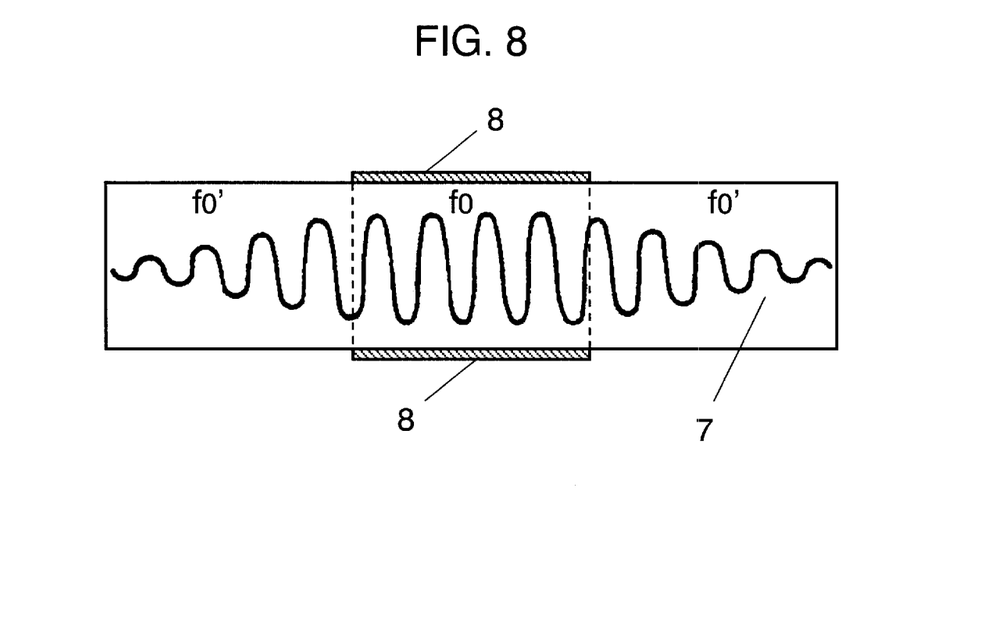
FIG. 8 is an explanatory diagram of a conventional energy confinement type PVE.

In the PVE or piezoelectric filter, it is sometimes required to use a specific vibration mode such as thickness slide vibration and thickness longitudinal vibration in a specific piezoelectric material. In such a case, when an excitation electrode is formed partially on the PVE principal surface, it is known that the vibration energy is confined only underneath the excitation electrode. Such phenomenon is known as energy confinement, which has been specifically analyzed by Shockley, Ogami and others. The energy confinement is described below by referring to the sectional view of the PVE in FIG. 8. As shown in FIG. 8, supposing the cut-off frequency in a certain portion of an excitation electrode 8 to be F 0, and the cut-off frequency in the non-electrode portion to be F 0'. In this case, at the frequency larger than F 0', the vibration energy freely propagates a vibration element 7. Even underneath the excitation electrode, its frequency does not form a stationary wave. However, at a frequency larger than F 0 and smaller than F 0', the vibration energy propagates freely in a certain portion of the excitation electrode 8. In the non-electrode portion, however, the vibration energy attenuates exponentially. Therefore, the vibration displacement is smaller as going toward the PVE end portion. As a result, the vibration energy is concentrated near the excitation electrode. Depending on the piezoelectric material, however, not satisfying the condition of energy confinement of LOWM, the condition of energy confinement is satisfied in the overtone mode. In this case, too, the mode to be excited most is the third-order overtone mode having a wavelength of three times in the thickness direction if the LOWM is first-order. Such materials include piezoelectric ceramics such as lead titanate material, lithium niobate 36° rotation Y-plate, and lithium niobate Z-plate. Using these materials, the PVE using the thickness longitudinal third-order overtone mode is developed practically. However, even if using a piezoelectric material of which LOWM does not satisfy the condition for energy confinement, a method of utilizing the overtone mode stably is disclosed. (for example, "Thickness longitudinal mode third-order harmonic vibrator using LiNbO3 36° rotation Y-plate, published in Journal of Society of Electronics, Information and Communication, Vol. J81-C-1, No. 6, pp. 357–364, 1998). The method disclosed in this literature requires optimization of dimensions of excitation electrode and holding method of PVE so as to suppress the LOWM excitation sufficiently.

Figure 9A:
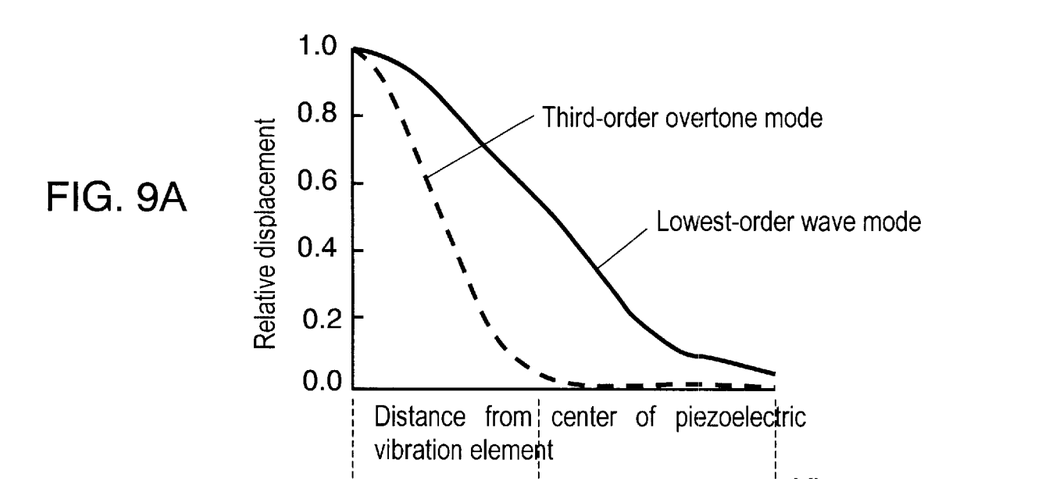
FIGS. 9A and 9B show a diagram explaining a relative displacement profile of LOWM and third-order overtone mode of the PVE shown in FIG. 8.
Figure 9B:
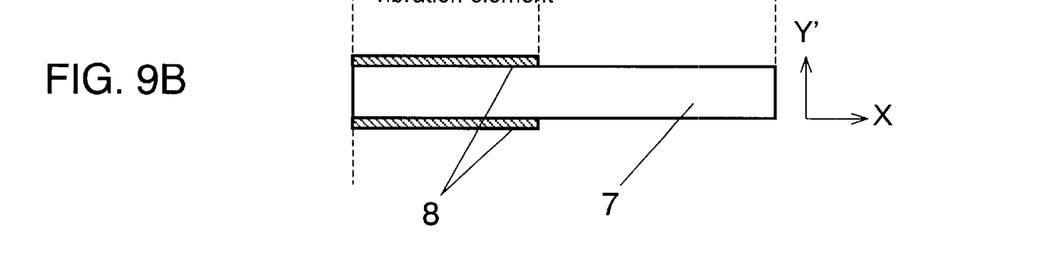
Figure 10A:
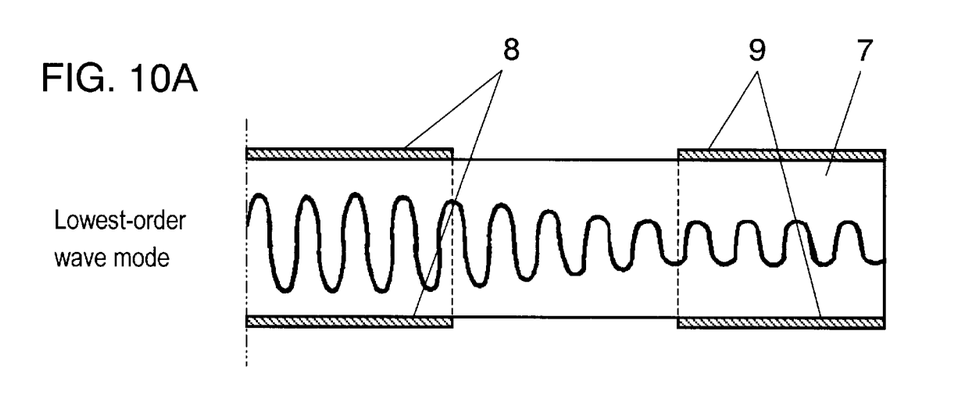
FIG. 10A is a diagram showing a mode of vibration energy propagation of the LOWM of the same.
Figure 10B:
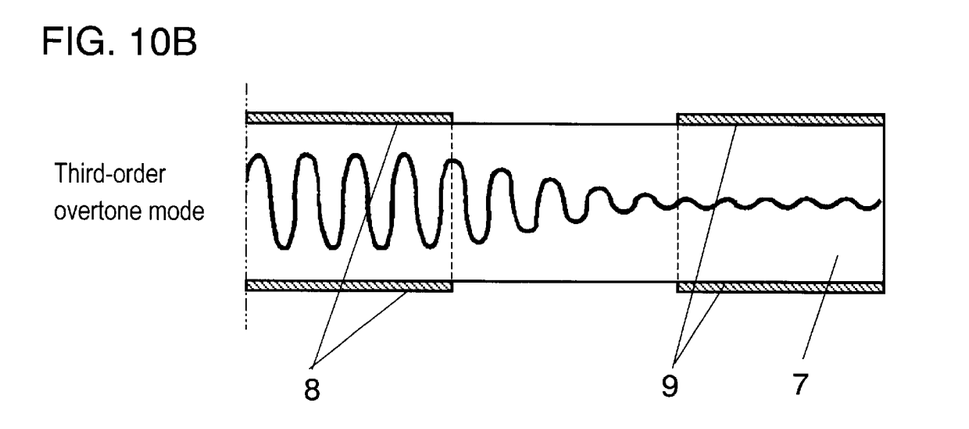
FIG. 10B is a diagram showing a mode of vibration energy propagation of the third-order overtone mode.

Or, when using a piezoelectric material of which LOWM satisfies the energy confinement condition, such as crystal AT plate, there is a method of using the overtone mode stably regardless of the circuit configuration. In this method, it is required to suppress the LOWM by the structure of the PVE. For example, by making use of the difference in the degree of energy confinement between the LOWM and overtone mode, an element forming an electrode of a certain mass near the PVE is known (for example, "Third-order overtone mode crystal vibrator suppressing fundamental wave mode (EFD vibrator)" disclosed in Toyo Communication Equipment Technical Bulletin No. 42, pp. 1–7, 1998). This principle is explained by referring to FIG. 9. FIG. 9 shows results of calculation of the relative displacement of LOWM and overtone mode in the PVE longitudinal direction. In the diagram, the axis of abscissas denotes the distance from the central part of the vibration element to the outer circumference, and the axis of ordinates represents the relative displacement supposing the vibration displacement in the center of the PVE to be 1. Hereinafter, this diagram is called the relative displacement profile. As mentioned in FIG. 8, by making use of the energy confinement, the vibration shows a sinusoidal wave underneath the excitation electrode. In the non-electrode portion, the vibration displacement attenuates exponentially. In FIG. 9, supposing the displacement of the element center to be 1, the relative displacement profile of the PVE having a set of electrodes becomes smaller as going away from the center. As shown in FIG. 9, the third-order overtone mode is superior in energy confinement than the LOWM. Therefore, the vibration displacement of the third-order overtone mode is distributed mostly underneath the excitation electrode. As known herein, however, the LOWM is large in the vibration displacement in the non-electrode portion, and the attenuation is insufficient. In the piezoelectric vibrator shown in FIGS. 10A, 10B, the vibration displacement of LOWM is large, and the mass of the electrode 9 and others is added to the region in which the vibration displacement of the overtone mode is almost 0, that is, in the periphery of the PVE. In the piezoelectric vibrator of this constitution, by lowering the cut-off frequency of the LOWM in the portion of the electrode 9, the vibration displacement of the LOWM is propagated to the outer circumference to leak the vibration energy, thereby suppressing the excitation level of the LOWM.

When using the overtone mode by the circuit configuration, as compared with the case of using the LOWM, the following problems were involves, that is, The number of parts is increased, such as coils and capacitors;

It is difficult to form in an IC because coils are used; and

It is difficult to realize an adjustment-free constitution.

Or in the case of use of piezoelectric material of which LOWM satisfies the energy confinement condition in the PVE, as a matter of course, the LOWM excitation level is higher than that of the overtone mode. Accordingly, as a method of suppressing the LOWM, it is known to make use of the difference in degree of energy confinement between the LOWM and overtone mode. This is a method of adding an electrode of a certain mass in the PVE peripheral area in the region where the vibration displacement of the LOWM is large and the vibration displacement of the overtone mode is almost 0. In this case, the cut-off frequency of the PVE peripheral area is changed due to oxidation of electrode material or change of interface of electrode film. By this change of cut-off frequency, the PVE by this method is unstable in propagation amount of vibration energy, and lacks in long-term reliability.

Or if the piezoelectric material of which LOWM does not satisfy the energy confinement condition is used in the PVE, in case of an insufficient suppression of LOWM, the PVE may induce oscillation frequency jump or other abnormal oscillation.

SUMMARY OF THE INVENTION

The invention is intended to solve the problems of the prior art, and it is hence an object thereof to present a PVE capable of suppressing the LOWM efficiently and allowing to utilize the overtone mode stably if made of a piezoelectric material of which LOWM satisfies the energy confinement condition, and also excellent in long-term reliability because the vibration element part and vibration propagation part are made of same material.

To achieve the object, the PVE of the invention comprises:

a) a vibration element part, b) a vibration propagation part made of a same material with a greater thickness than the vibration element part, c) a groove disposed in the boundary of the vibration element part and vibration propagation part, d) excitation electrodes confronting the face side and back side of the vibration element part, e) a connection electrode disposed in the vibration propagation part, and f) an external lead-out electrode connected electrically to the connection electrode.

The PVE having such constitution mainly vibrates in the overtone mode of which wavelength in the thickness direction is (2n+1) times (n being a natural number) of LOWM when the LOWM is first-order or second-order.

In this constitution, the PVE of the invention brings about the following two effects:

An effect of leak of vibration energy of LOWM through the vibration propagation part; and An effect of increasing the resonance impedance by disturbing the resonance of LOWM as the reflected wave of vibration occurring in the groove portion induces an undesired vibration.

Owing to these two effects, the PVE of the invention is:

1. Capable of suppressing the LOWM efficiently if using a piezoelectric material of which LOWM satisfies the energy confinement condition;

2. Excellent in long-term reliability because the vibration element part and vibration propagation part are made of a same material; and 3. Decreased in the number of parts because a tuning circuit of coil and capacitor is not needed in the oscillation circuit.

The ratio 2h/H, where h is the depth of the groove in the boundary of the vibration element part and vibration propagation part of the PVE of the invention and H is the thickness of the vibration element part, is defined to be 2/3 or less.

The main vibration of the PVE of the invention is the thickness slide vibration, and the vibration element part and vibration propagation part are integrated only in the vibration propagation direction.

The vibration propagation part of the PVE of the invention is formed by applying a vibration-absorbing material on its outer circumference.

The vibration-absorbing material of the PVE of the invention is a conductive material.

The vibration propagation part of the PVE of the invention has an upper lid or a lower lid, or both of them.

The vibration element part of the PVE of the invention has at least a pair of input electrode and output electrode at one side of its principal plane, and a grounding electrode at other principal plane.

DESCRIPTION OF THE PREFERRED EMBODIMENTS

First Exemplary Embodiment

Referring now to the drawings, the PVE according to a first embodiment of the invention is described below.

Figure 1A:
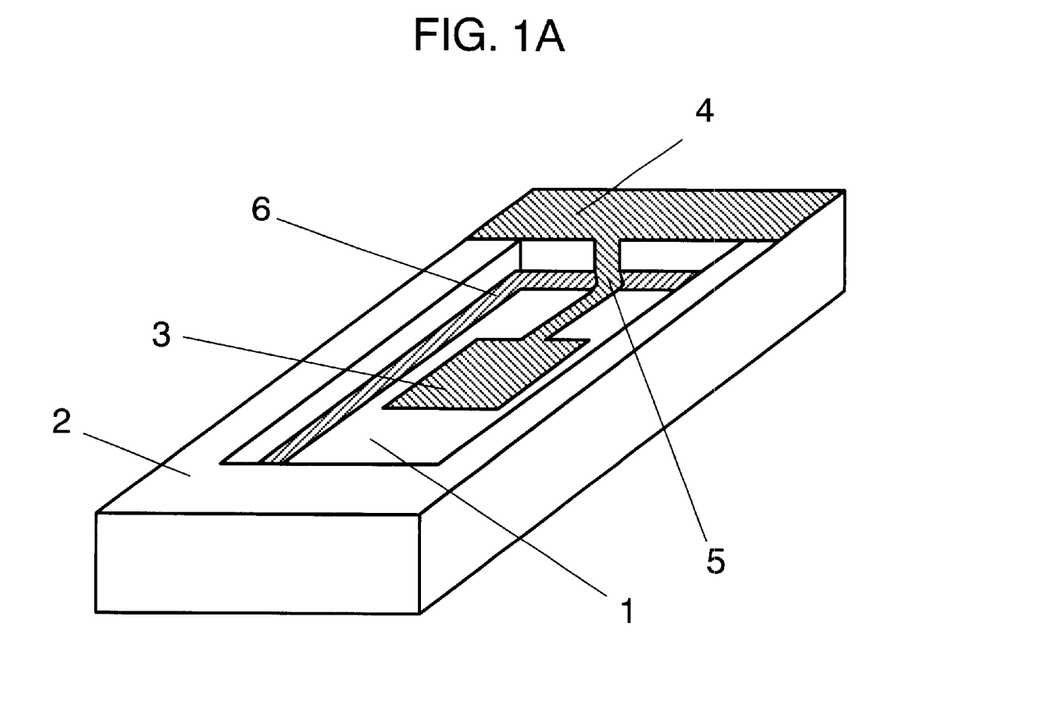
FIG. 1A is a perspective view of a PVE in an embodiment of the invention.
Figure 1B:
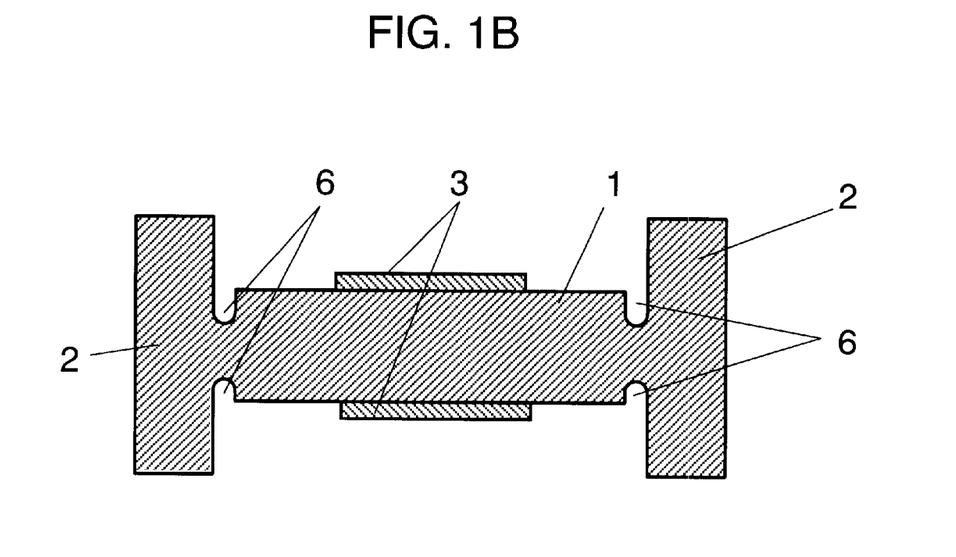
FIG. 1B is a sectional view of a piezoelectric vibration element shown in FIG. 1A.

As shown in FIGS. 1A and 1B, the PVE of the embodiment comprises:

a) a vibration element part 1, b) a vibration propagation part 2 made of a same material with a greater thickness than the vibration element part 1, c) a groove 6 disposed in the boundary of the vibration element part 1 and vibration propagation part 2, d) excitation electrodes 3 confronting the face side and back side of the vibration element part 1, e) a connection electrode 4 disposed in the vibration propagation part 2, and f) an external lead-out electrode 5 connected electrically to the connection electrode 4.

The vibration element part 1 and vibration propagation part 2 are composed integrally through the groove 6. The excitation electrodes 3 are electrically connected to the connection electrode 4 disposed in the vibration propagation part 2 through the external lead-out electrode 5.

The PVE having such constitution is described below. The following example relates to a PVE of which main vibration is the thickness slide vibration, using a crystal AT plate with a plate thickness of 120 $\mu$m in the vibration element part.

In the constitution shown in FIGS. 1A and 1B, the vibration energy is confined underneath the excitation electrodes 3. However, the degree of attenuation of vibration displacement due to energy confinement depends not only on the size of the excitation electrode 3 but also on the mass of the excitation electrode 3. The greater the mass of the excitation electrode 3, the larger is the attenuation of the vibration displacement. On the other hand, if the mass of the excitation electrode 3 is too large, the excitation electrode 3 of a large mass becomes a loss component for impeding the vibration. As a result, the excitation electrode 3 of a large mass is one of the factors for increasing the resonance impedance. Therefore, the excitation electrode 3 is generally formed by applying silver or gold on the PVE principal plane by about hundreds to thousands of angstroms.

Figure 2A:
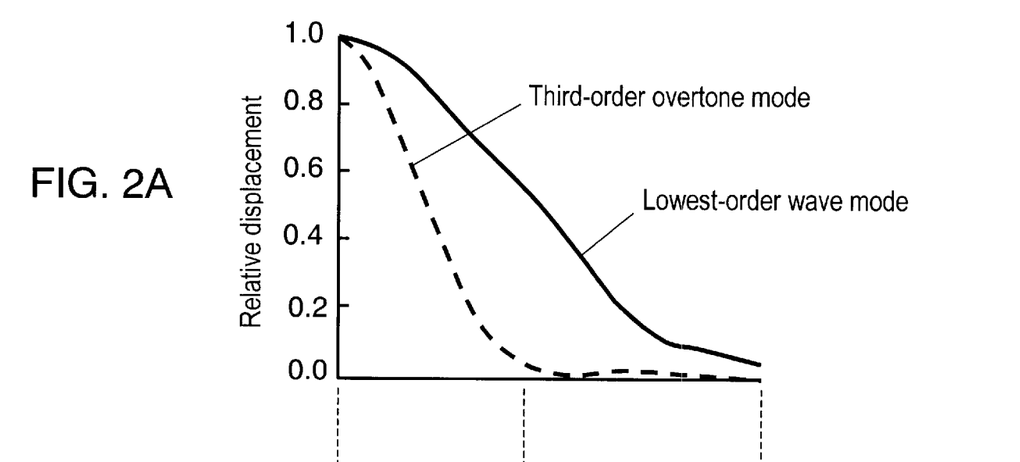
FIG. 2A is a diagram explaining a relative displacement profile of LOWM and third-order overtone mode of the PVE made of a single plate.
Figure 2B:
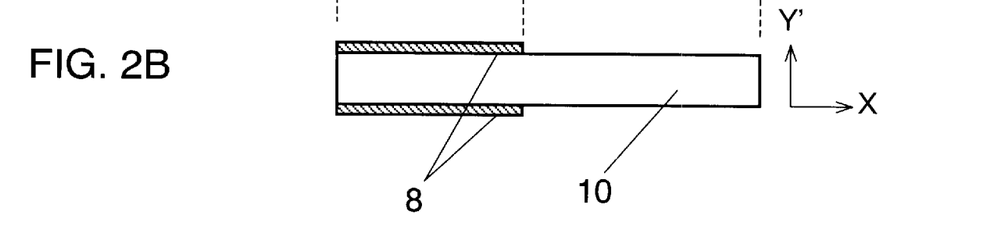
FIG. 2B is a sectional view of the PVE shown in FIG. 2A.

Supposing to use gold as the material for the excitation electrode, in the following example, an excitation electrode of 3000 angstroms in thickness is formed on the face and back side of the PVE principal plane in its center. By way of comparison, FIG. 2B shows a constitution of PVE not suppressed in the LOWM. This PVE is a completely flat single plate. FIG. 2A shows the relative displacement profile of LOWM and third-order overtone mode of the PVE in FIG. 2B. In FIG. 2A, the axis of abscissas denotes the distance in the vibration propagation direction from the center of the PVE 10, and the axis of ordinates represents the relative displacement supposing the displacement of the LOWM and third-order overtone mode of the PVE 10 in the center to be 1 respectively. By the energy confinement phenomenon, the vibration displacement attenuates as going toward the end of the PVE. However, there is a difference in the energy confinement performance between the LOWM and third-order overtone mode. The relative displacement at the end of the PVE of the LOWM is about 0.02, and the relative displacement of the third-order overtone mode is about 0.003. The relative displacement at the end of the excitation electrode 8 of the LOWM is about 0.56, and the relative displacement of the third-order overtone mode is about 0.04.

Figure 3A:
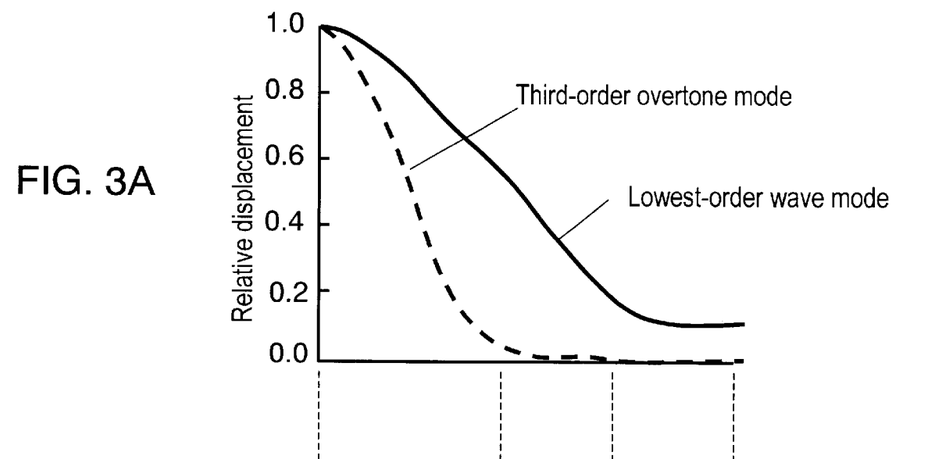
FIG. 3A is a diagram explaining a relative displacement profile of LOWM and third-order overtone mode in an integrated structure of vibration element part and vibration propagation part.
Figure 3B:
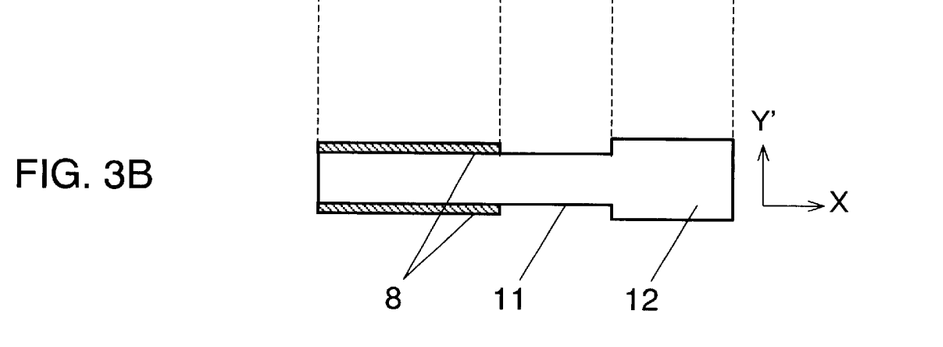
FIG. 3B is a sectional view of the PVE shown in FIG. 3A.

FIG. 3B shows a PVE having no groove in the boundary of vibration element part 11 and vibration propagation part 12 which are made of same material and are integrated. FIG. 3A shows a relative displacement profile of the PVE shown in FIG. 3B. The PVE of the structure shown in FIG. 3B has the same effects as the PVE shown in FIGS. 10A and 10B in the aspect that the cut-off frequency in the vibration propagation part 12 is decreased. However, since the vibration element part 11 and vibration propagation part 12 are made of same material, it is excellent in long-term reliability. As shown in FIG. 3A, the third-order overtone mode attenuates sufficiently with the relative displacement at the end of the excitation electrode being about 0.04, and the relative displacement of the vibration propagation part 12 in FIG. 3B is nearly equal to 0 in vibration displacement same as in the case of FIG. 2B. In the PVE in FIG. 3B, the LOWM corresponds to the non-electrode portion 11 between the excitation electrode 8 and vibration propagation part 12, and the vibration displacement attenuates. However, the vibration displacement does not attenuate in the vibration propagation part 12, and at the end of the PVE, the relative displacement is about 0.12. Comparing with the relative displacement at the end of the PVE of the LOWM in the case of FIG. 2B, the relative displacement in FIG. 3B is about 6 times of the relative displacement in FIG. 2B. This difference in relative displacement means that the vibration energy of the LOWM leaks outside by the provision of the vibration propagation part 12. As a result, in the PVE in FIG. 3B, the resonance impedance of the LOWM increases, and the LOWM can be suppressed.

Figure 4A:
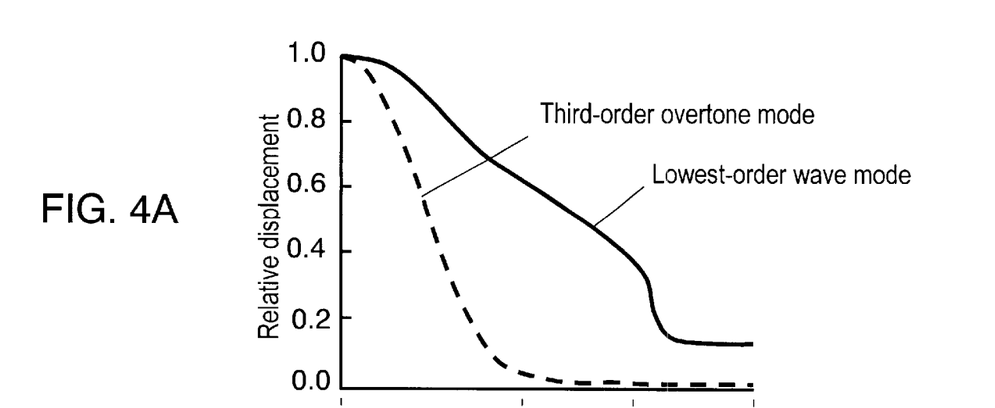
FIG. 4A is a diagram explaining a relative displacement profile of LOWM and third-order overtone mode in an integrated structure of vibration element part and vibration propagation part of the PVE having a groove in the boundary.
Figure 4B:
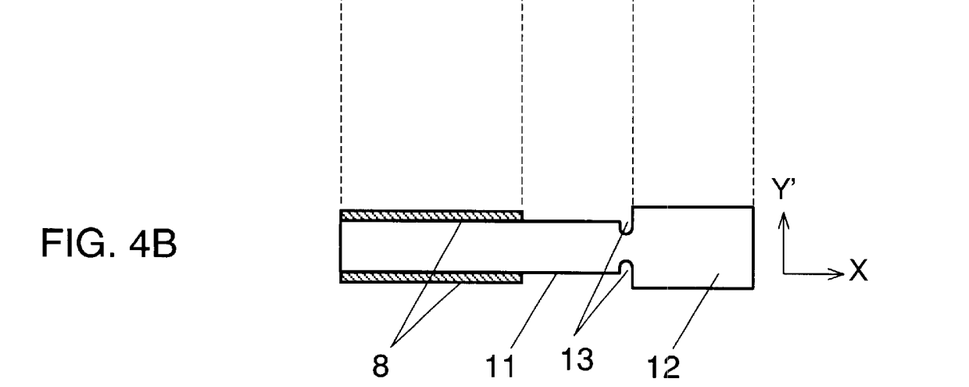
FIG. 4B is a sectional view of the PVE shown in FIG. 4A.

However, if a groove is provided in the boundary of the vibration element part and vibration propagation part, the LOWM can be suppressed more effectively as explained below. In the PVE in FIG. 4B, in the boundary of the vibration element part 11 and vibration propagation part 12 of the PVE in FIG. 3B, a groove 13 of 10 μm in width and 13 μm in depth is formed. This groove 13 is formed in both of the face and the back side of the principal plane of the piezoelectric vibrator. FIG. 4A shows a relative displacement profile of the PVE in FIG. 4B. The vibration displacement of the third-order overtone mode attenuates sufficiently at the end of the excitation electrode 8, and same as in the PVE in FIG. 2B and FIG. 3B, the vibration displacement in the vibration propagation part is nearly equal to 0. However, the relative displacement at the end of the piezoelectric vibrator of the LOWM is about 0.12, which is nearly same as in the piezoelectric vibrator in FIG. 3B. Therefore, the vibration energy leak effect of the LOWM seems to be nearly same as in the PVE in FIG. 3B. Herein, paying attention to the vibration displacement of the LOWM in the boundary of the vibration element part 11 and vibration propagation part 12, in the PVE without groove as in FIG. 3B, the relative displacement is about 0.17. In the PVE having groove as in FIG. 4B, the relative displacement is 0.36. In the case of the PVE having the groove 13, the relative displacement is about 2 times that without groove 13. It means that the vibration of the LOWM not attenuated sufficiently is reflected in the groove area. The reflected wave of vibration is an undesired vibration for the resonance of LOWM, which is effective to increase the resonance impedance of the LOWM. As mentioned earlier, moreover, even if the groove is provided, the size of the displacement of the LOWM at the end of the PVE is almost the same. As a result, the leak effect of the vibration energy of LOWM to outside is combined with the effect of increasing the resonance impedance of the LOWM as the reflected wave formed in the groove area induces an undesired vibration. Therefore, the PVE shown in FIG. 4B can suppress the LOWM efficiently.

Figure 5A:
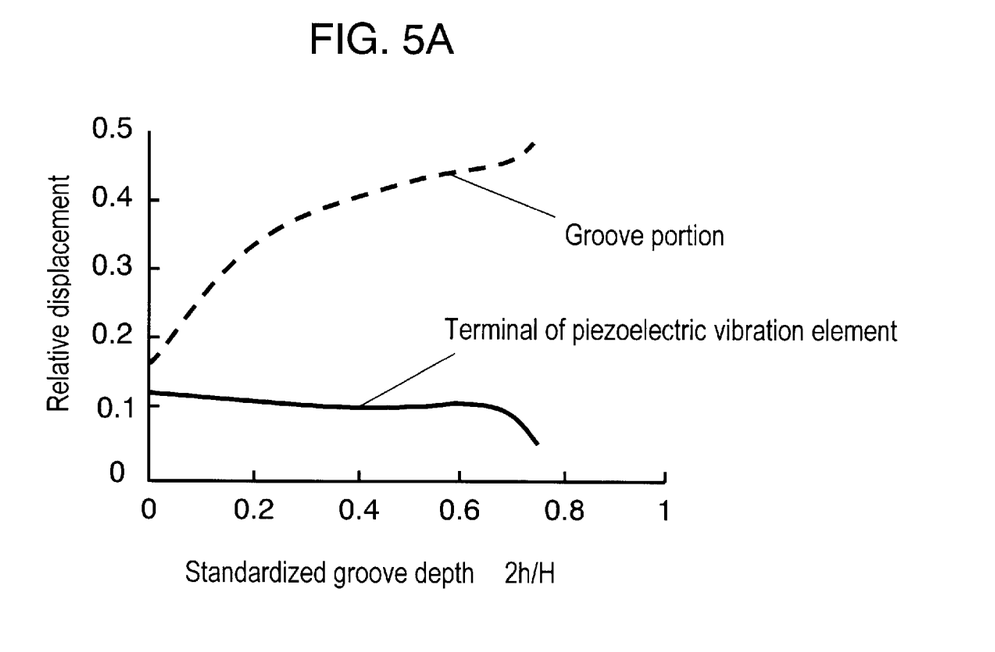
FIG. 5A is a diagram explaining the relation between the depth of the standardized groove and the size of the relative displacement of the PVE.
Figure 5B:
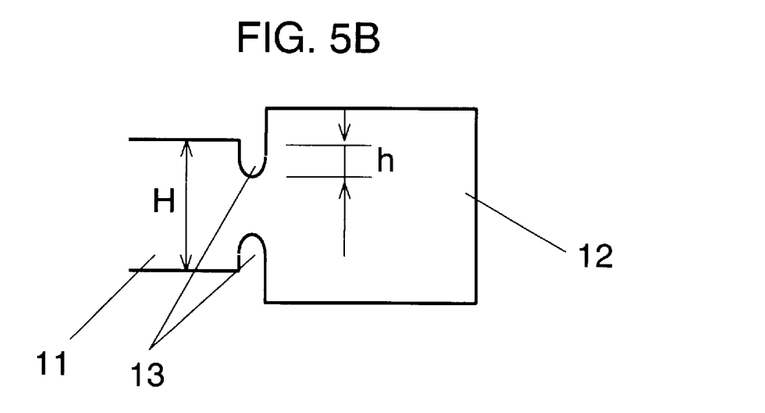
FIG. 5B is a diagram explaining the depth of the standardized groove of the PVE.

FIG. 5A shows a relative displacement to the standardized groove depth (2h/H) shown in FIG. 5B. The axis of abscissas in FIG. 5A denotes the standardized groove depth (2h/H), and the axis of ordinates represents the relative displacement at the end of the PVE and in the boundary of the vibration element part and vibration propagation part. Herein, the standardized groove depth (2h/H) of the axis of abscissas is standardized by the plate thickness H of the PVE and the groove depth h. The vibration displacement in the boundary of the vibration element part 11 and vibration propagation part 12 is an index for the effect of suppressing the LOWM by the reflected wave. As shown in FIG. 5A, the vibration displacement in the groove area in the boundary increases as the standardized groove depth 2h/H is larger. On the other hand, the vibration displacement at the end of the PVE is an index for the effect of leak of the vibration energy of the LOWM to outside. The vibration displacement at the end of the PVE is nearly constant at the standardized groove depth up to about 0.67, but decreases suddenly when exceeding this level. This is because the effective sectional area for propagation of the vibration energy in the vibration propagation part 12 becomes smaller. Or, as shown in FIG. 5B, if the groove 13 is too deep, a problem occurs in the mechanical strength. Therefore, the standardized groove depth 2h/H is preferred to be 2/3 (about 0.67) or less. The forming method of the groove 13 includes a mechanical process such as sand blasting. By such method, the mechanical strength of the groove 13 may be decreased due to effects of processed degenerated layer. In such a case, by making use of difference in etching speed by chemical etching, a fine groove free from processed degenerated layer may be formed easily.

Second Exemplary Embodiment

A piezoelectric filter in a second embodiment of the invention is described below while referring to the drawings.

Figure 6A:
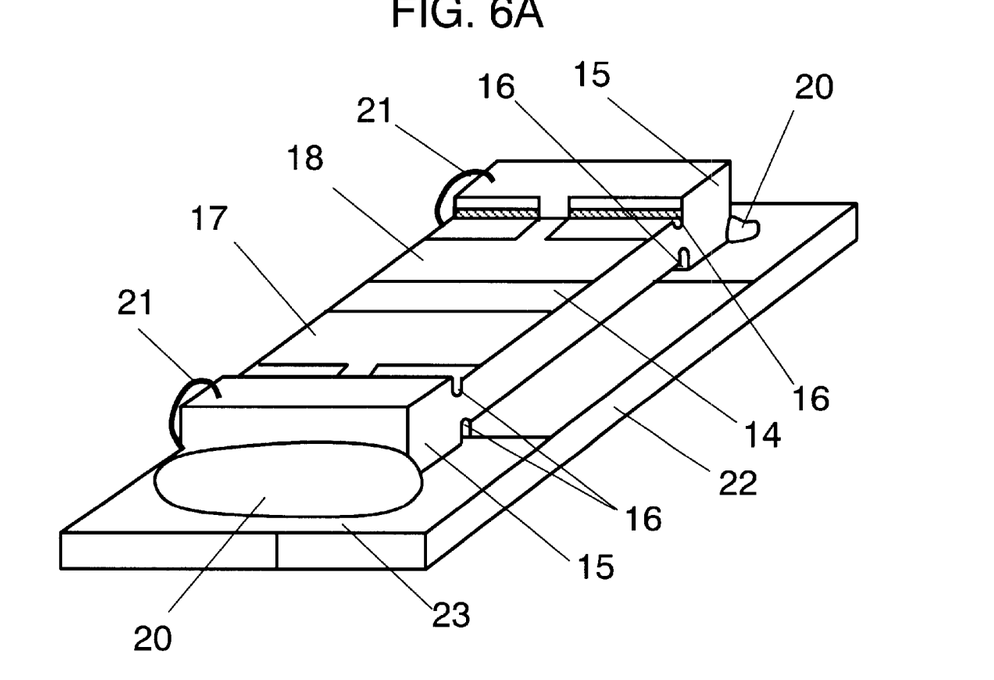
FIG. 6A is a perspective view of a piezoelectric filter as a practical example of embodiment 2 of the invention.
Figure 6B:
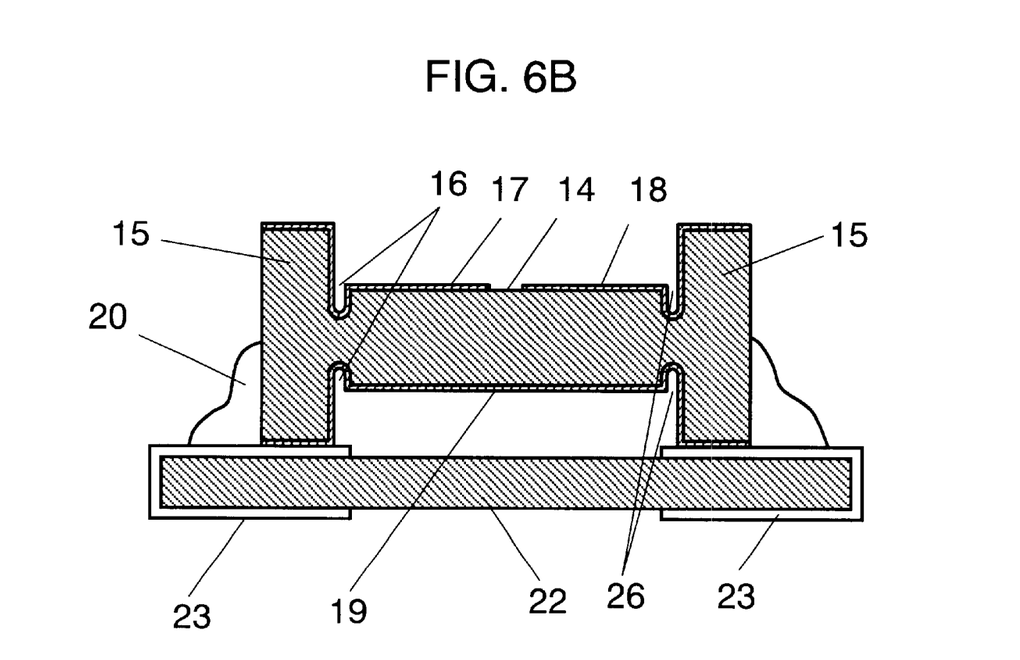
FIG. 6B is a sectional view of the PVE shown in FIG. 6A.

FIGS. 6A and 6B are a piezoelectric filter of which main vibration is thickness slide vibration, using a crystal AT plate. FIG. 6A shows the appearance of the piezoelectric filter, and FIG. 6B is a sectional view of FIG. 6A.

The piezoelectric filter of the second embodiment comprises:
a PVE including:
  a) a vibration element part 14 composed of a crystal AT plate,
  b) vibration propagation parts 15 disposed at both ends in the longitudinal direction which is the vibration propagation direction of the vibration element part 14,
  c) a groove 16 formed in the boundary of the vibration element part 14 and vibration propagation parts 15,
  d) an input electrode 17 formed at one end of the principal plane of the vibration element part 14,
  e) an output electrode 18 formed at other end of the principal plane of the vibration element part 14,
  f) a grounding electrode 19 formed on the back side of the vibration element part 14,
  g) a vibration-absorbing material 20 composed of a conductive material formed at the side of the vibration propagation parts 15, and
  h) a fine metal wire 21 for keeping conduction between external terminals of the input electrode 17 and output electrode 18,
a mounting substrate 22 for mounting the PVE, and
an external terminal 23 for transmitting an electric signal from the mounting substrate 22 to outside.

This PVE is rectangular in shape. When the electrode is formed in the entire element width direction, the energy cannot be confined in the width direction. Therefore, the displacement of end portion of the element width direction does not attenuate so much. Hence, in this PVE, the vibration propagation part is not disposed in the width direction so as not to impede the vibration of the overtone mode in the width direction, and is disposed only in the vibration propagation direction. Same as in the first embodiment, the vibration element part 14 and vibration propagation part 15 are made of a same material.

In this structure, although the vibration displacement is not attenuated sufficiently, the vibration energy of the LOWM leaks outside through the vibration propagation part 15. Moreover, the vibration-absorbing material 20 made of conductive material is applied on the vibration propagation part 15. Therefore, the piezoelectric filter of the embodiment can absorb the leaking vibration energy efficiently while keeping conduction between the external terminal 23 and the grounding terminal 19. In the groove 16 in the boundary between the vibration element part 14 and vibration propagation part 15, reflection of vibration of the LOWM occurs, and undesired vibration takes place. Accordingly, the PVE of the embodiment also has the effect of disturbing the resonance of the LOWM and increasing its resonance impedance. Therefore, the piezoelectric filter suppressing the LOWM efficiently and utilizing the stable overtone mode is realized.

Third Exemplary Embodiment

A PVE in a third embodiment of the invention is described below while referring to the drawings.

Figure 7A:
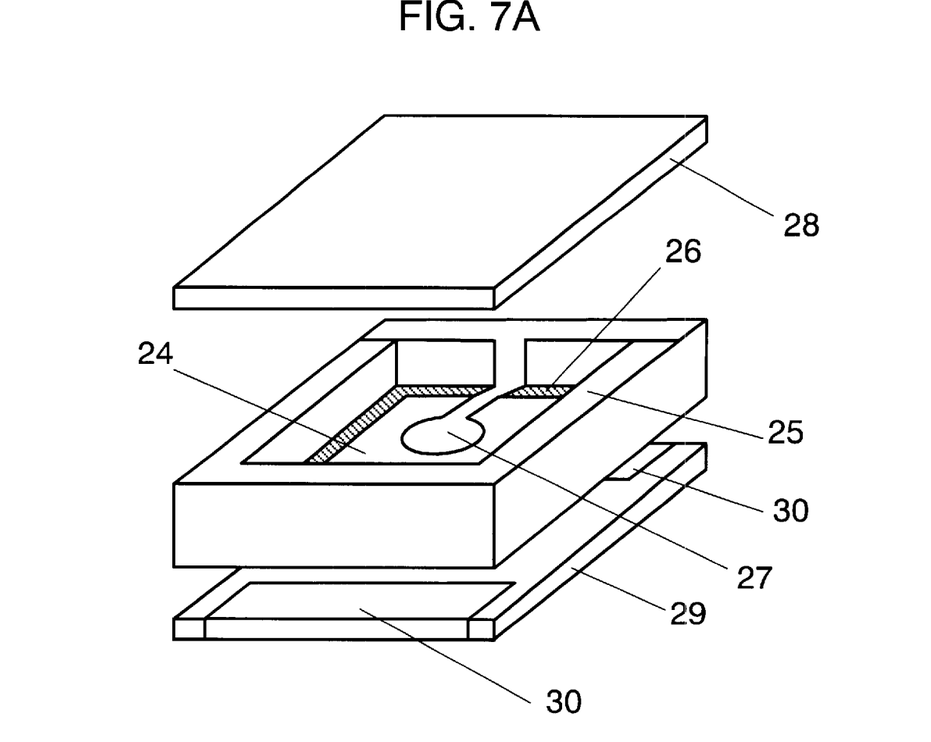
FIG. 7A is a perspective view of a piezoelectric element inverted in the axis of polarization in the center of the thickness direction of lithium niobate Z plate as a practical example of embodiment 3 of the invention.
Figure 7B:
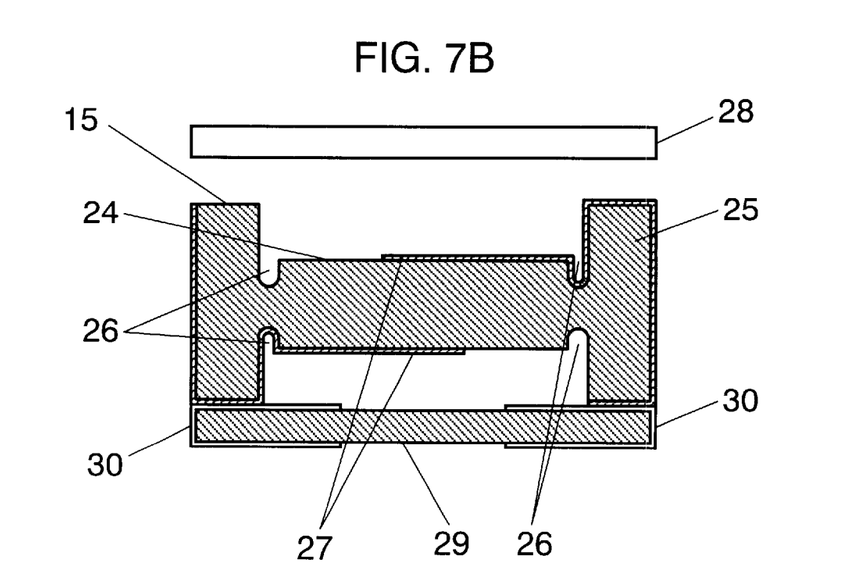
FIG. 7B is a sectional view of the PVE shown in FIG. 7A.

FIG. 7A and FIG. 7B show a PVE of which main vibration is thickness longitudinal vibration, having a structure inverted in the axis of polarization in the center of the thickness direction of lithium niobate Z plate. FIG. 7A is an appearance view of the PVE, and FIG. 7B is a sectional view of FIG. 7A.

The PVE of the third embodiment comprises:

a) a vibration element part 24 composed of a lithium niobate Z plate, b) a vibration propagation part 25 made of a same material as the vibration element part 24 and integrated therewith, c) a groove 26 formed in the boundary of the vibration element part 24 and vibration propagation part 25, d) excitation electrodes 27 confronting face and back sides of the vibration element part 24, e) an upper lid 28 in the upper part of the vibration propagation part 25, f) a lower lid 29 in the lower part of the vibration propagation part 25, and g) an external terminal 30 disposed in the lower lid 29.

When the axis of polarization is oriented in one direction only, the lithium niobate Z plate cannot confine the energy of the first-order mode. However, when the axis of polarization is inverted in the center of the thickness direction, the LOWM is the second-order mode. Therefore, the energy can be confined. Since the LOWM is the second-order mode, the overtone mode is the sixth-order, tenth-order, fourteenth-order, and so forth.

As shown in FIGS. 7A and 7B, on and under the PVE, the upper lid 28 and lower lid 29 are provided. Since the thickness of the vibration element part 24 is smaller than that of the vibration propagation part 25, the vibration of the vibration element part 24 will not be impeded. Therefore, the PVE of this embodiment may be put in a package. Moreover, since the vibration propagation part 25 can be utilized as the outer circumference of the package, the PVE can be reduced in size. In particular, the height of the PVE can be lowered. The vibration energy propagating to the vibration propagation part 25 is the second-order mode (LOWM). Therefore, if the lids are provided, the overtone mode characteristic is hardly changed.

Same as in the first embodiment, the vibration propagation part 25 has the effect of leak of vibration energy of second-order mode to outside. Further, in the groove 26 in the boundary of the vibration element part 24 and vibration propagation part 25, reflection of vibration of LOWM occurs, and undesired vibration takes place. It hence adds an effect of disturbing the resonance of the LOWM and increasing its resonance impedance. As a result, the PVE suppressing the LOWM efficiently and using the stable overtone mode is realized.

In the foregoing description, mainly, the example of PVE using piezoelectric single crystal is explained, but the same effects are obtained in the PVE made of other piezoelectric materials such as piezoelectric ceramics.

As described herein, the PVE and piezoelectric filter of the invention have the following two effects:

An effect of leak of vibration energy of LOWM through the vibration propagation part; and An effect of increasing the resonance impedance by disturbing the resonance of LOWM as the reflected wave of vibration occurring in the groove portion induces an undesired vibration.

As a result, even in the case of using a piezoelectric material of which LOWM satisfies the energy confinement condition, the PVE and piezoelectric filter of the invention are:

Capable of suppressing the LOWM efficiently;

Excellent in long-term reliability because the vibration element part and vibration propagation part are made of a same material; and Decreased in the number of parts because a tuning circuit of coil and capacitor is not needed in the oscillation circuit.

What is claimed is:

1. A piezoelectric vibration element comprising a vibration element part, a vibration propagation part made of a same material with a greater thickness than said vibration element part, and a groove disposed in the boundary of said vibration element part and said vibration propagation part, said groove sufficiently narrow to substantially prevent attenuation of said vibration propagation part from vibration generated in said vibration element part, and an excitation electrode in contact with said vibration element part, said excitation electrode spaced away from a closest edge of said groove.

2. The piezoelectric vibration element of claim 1, wherein the main vibration is the overtone mode, that is, when the lowest order wave mode is first-order or second-order, the wavelength in the thickness direction is (2n+1) times (n being a natural number) of the lowest order wave mode.

3. The piezoelectric vibration element of claim 2, wherein the ratio 2h/H is 2/3 or less where h is the depth of the groove in the boundary of the vibration element part and vibration propagation part and H is the thickness of the vibration element part.

4. The piezoelectric vibration element of claim 2, wherein the main vibration is the thickness slide vibration, and the vibration element part and vibration propagation part are integrated only in the vibration propagation direction.

5. The piezoelectric vibration element of claim 2, wherein said vibration propagation part has a vibration-absorbing material applied on its outer circumference.

6. The piezoelectric vibration element of claim 5, wherein said vibration-absorbing material is a conductive material.

7. The piezoelectric vibration element of claim 2, wherein said vibration propagation part has an upper lid or a lower lid, or both of them.

8. The piezoelectric vibration element of claim 2, wherein said vibration element part has at least a pair of input electrode and output electrode on its one principal plane, and a grounding electrode on the other principal plane.

9. A piezoelectric vibration element according to claim 1, wherein the main vibration is the overtone mode, and wherein said vibration element part being connected to said vibration propagation part at a position where the main vibration sufficiently attenuates, and said groove reflecting a lowest order wave mode vibration generated in said vibration element part.

* * * * *